(12) United States Patent
Ishii et al.

(10) Patent No.: US 8,879,334 B2
(45) Date of Patent: Nov. 4, 2014

(54) SEMICONDUCTOR DEVICE HAVING TIMING CONTROL FOR READ-WRITE MEMORY ACCESS OPERATIONS

(71) Applicant: Renesas Electronics Corporation, Kawasaki (JP)

(72) Inventors: Yuichiro Ishii, Kanagawa (JP); Yoshikazu Saito, Kanagawa (JP); Shinji Tanaka, Kanagawa (JP); Koji Nii, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/750,328

(22) Filed: Jan. 25, 2013

(65) Prior Publication Data

US 2013/0194882 A1 Aug. 1, 2013

(30) Foreign Application Priority Data

Jan. 30, 2012 (JP) ................................. 2012-016595

(51) Int. Cl.
| | | |
|---|---|---|
| G11C 7/00 | (2006.01) | |
| G11C 7/10 | (2006.01) | |
| G11C 8/16 | (2006.01) | |
| G11C 7/22 | (2006.01) | |
| G11C 11/419 | (2006.01) | |

(52) U.S. Cl.
CPC .............. *G11C 7/222* (2013.01); *G11C 7/1075* (2013.01); *G11C 8/16* (2013.01); *G11C 11/419* (2013.01)
USPC ................. 365/189.011; 365/49.11; 365/154; 365/156; 365/189.15; 365/189.16; 365/188; 365/190; 365/205; 365/207

(58) Field of Classification Search
CPC ...... G11C 15/04; G11C 15/00; G11C 7/1006; G11C 7/1051; G11C 7/22; G11C 7/1078; G11C 11/412; G11C 11/413; G11C 7/06; G11C 11/419; G11C 11/4091; G11C 7/065; G11C 7/12; H01L 27/1104; H01L 27/1112
USPC .......... 365/49.11, 154, 156, 189.011, 189.02, 365/189.15, 189.16, 188, 190, 205, 207
See application file for complete search history.

(56) References Cited

U.S. PATENT DOCUMENTS

| | | | |
|---|---|---|---|
| 8,619,464 B1 * | 12/2013 | Sinha et al. ................... | 365/154 |
| 2008/0285872 A1 * | 11/2008 | Fukuhara et al. ............. | 382/248 |
| 2010/0008168 A1 * | 1/2010 | Chang .......................... | 365/194 |
| 2012/0320694 A1 * | 12/2012 | Gajjewar et al. ............. | 365/194 |

* cited by examiner

FOREIGN PATENT DOCUMENTS

JP 2010-135025 A 6/2010

OTHER PUBLICATIONS

Ishii, Y., et al., "A 28 nm dual-port SRAM macro with screening circuitry against write-read disturb failure issues", A-SSCC 2010 literature No. Industry1-2.

*Primary Examiner* — Fernando Hidalgo
(74) *Attorney, Agent, or Firm* — Womble Carlyle

(57) ABSTRACT

A semiconductor device avoids the disturb problem and the collision between write and read operations in a DP-SRAM cell or a 2P-SRAM cell. The semiconductor device 1 includes a write word line WLA and a read word line WLB each coupled to memory cells 3. A read operation activates the read word line WLB corresponding to the selected memory cell 3. A write operation activates the write word line WLA corresponding to the selected memory cell 3. The selected write word line WLA is activated after activation of the selected read word line WLB in an operation cycle that performs both read and write operations.

9 Claims, 13 Drawing Sheets

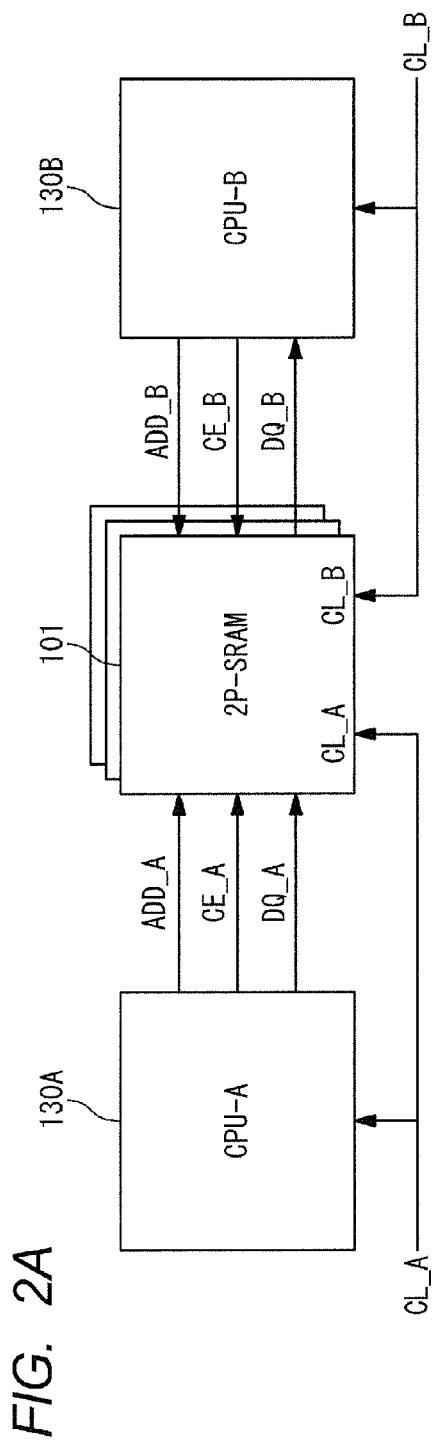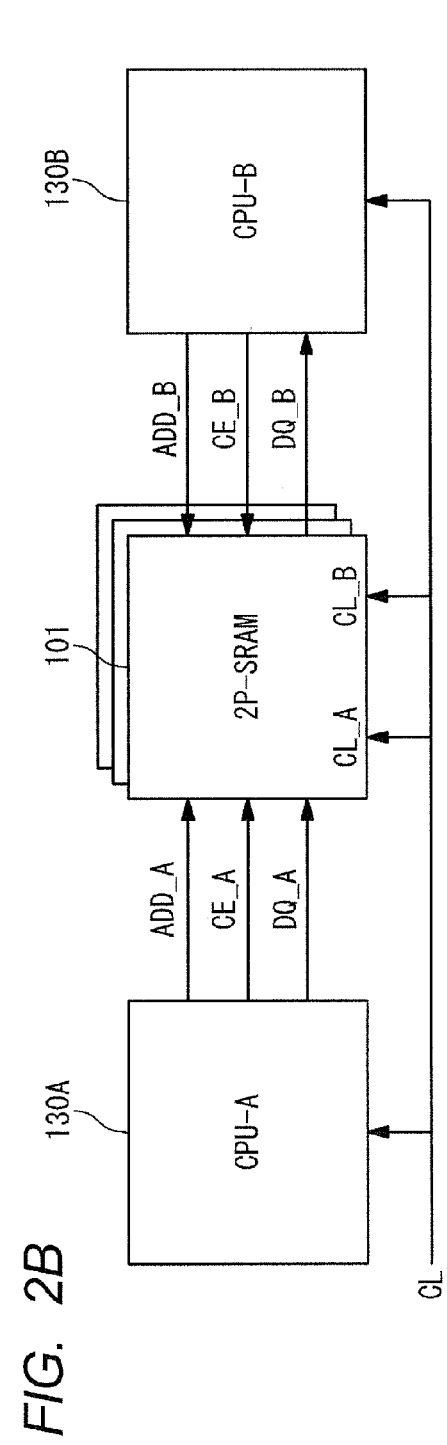

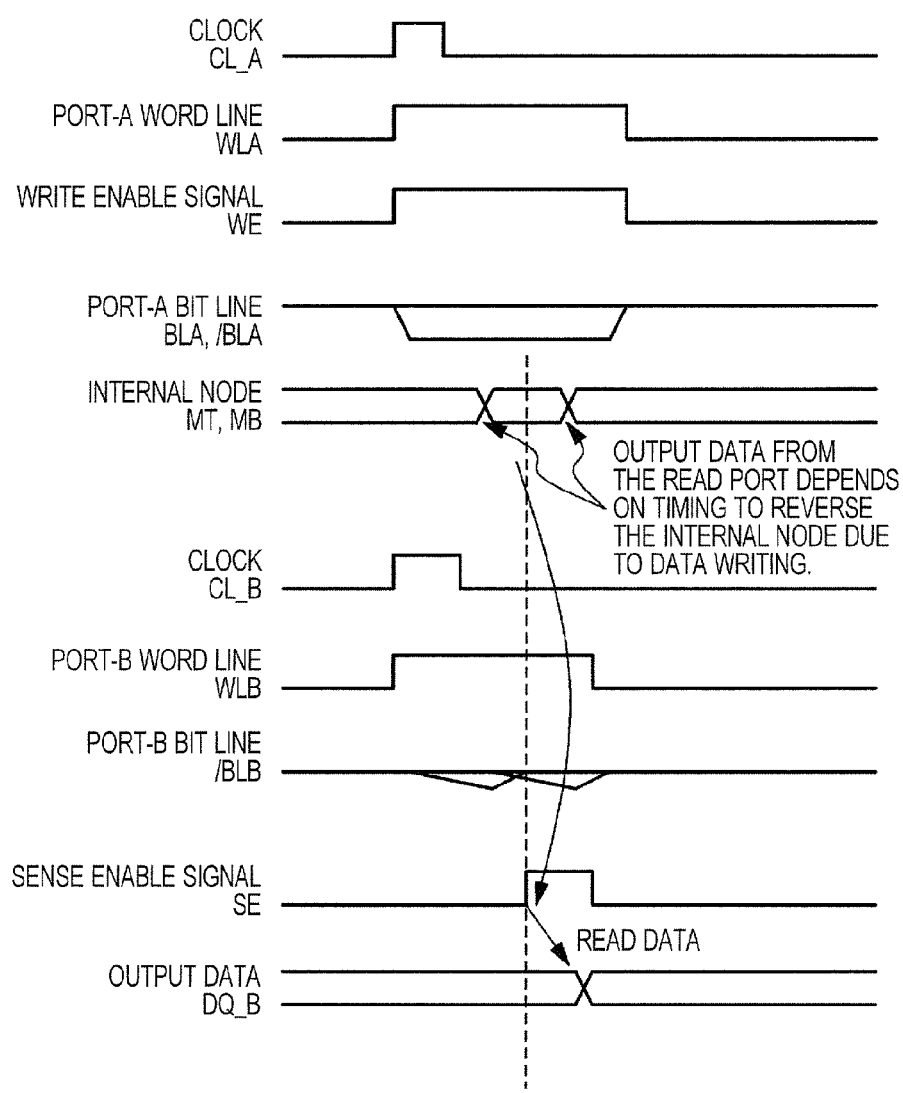

SEMICONDUCTOR DEVICE HAVING TIMING CONTROL FOR READ-WRITE MEMORY ACCESS OPERATIONS

CROSS-REFERENCE TO RELATED APPLICATIONS

The disclosure of Japanese Patent Application No. 2012-016595 filed on Jan. 30, 2012 including the specification, drawings and abstract is incorporated herein by reference in its entirety.

BACKGROUND

The present invention relates to a semiconductor device. More particularly, the invention relates to a semiconductor device including a DP-SRAM (dual port static random access memory) cell or a 2P-SRAM (two port static random access memory) cell.

There is the widespread use of SOC (system on chip) or ASIC (application specific integrated circuit) for high-speed communication and image processing and DP-SRAM or 2P-SRAM having two input/output ports on microcomputers.

Generally, the DP-SRAM or the 2P-SRAM has two input/output ports. Each port independently has a clock terminal or a timing generation circuit. FIG. 1 is a block diagram illustrating a configuration of a 2P-SRAM 101 having port A used as a write port and port B used as a read port. The 2P-SRAM 101 includes a memory cell array 102 provided with memory cells 103 in rows and columns, an I/O circuit 104, a port-A peripheral circuit 120A, and a port-B peripheral circuit 120B. The memory cell 103 is configured as a DP-SRAM cell. The memory cell array 102 is provided with a port-A word line WLA, a port-B word line WLB, a pair of port-A bit lines BLA and /BLA, and a pair of port-B bit lines BLB and /BLB. These lines are coupled to the memory cells 103.

The I/O circuit 104 includes an input latch 105, a write driver 106, multiplexers 107 and 108, a sense amplifier 109, and an output latch 110.

The port-A peripheral circuit 120A includes a timing generation circuit 111A, an address pre-decoder 112A, write latch circuits 113A and 114A, and a write word line driver 115A. Similarly, the port-B peripheral circuit 120B includes a timing generation circuit 111B, an address pre-decoder 112B, latch circuits 113B and 114B, and a word line driver 115B.

The 2P-SRAM 101 in FIG. 1 uses port A as a write port and port B as a read port. Port A includes an input latch 105, a write driver 106, a multiplexer 107, and a port-A peripheral circuit 120A. Port B includes a multiplexer 108, a sense amplifier 109, an output latch 110, and a port-B peripheral circuit 120B. Ports A and B are supplied with different clock signals. Ports A and B operate asynchronously. Specifically, the timing generation circuit 111A for port A is supplied with clock signals CL_A. The timing generation circuit 111B for port A is supplied with clock signals CL_B. The circuits for port A operate in synchronization with clock signal CL_A. The circuits for port B operate in synchronization with clock signal CL_B.

The DP-SRAM is discussed in Y. Ishii, et al., "A 28 nm dual-port SRAM macro with screening circuitry against write read disturb failure issues", A-SSCC 2010 literature number Industry1-2, for example.

FIG. 2A is a block diagram illustrating a configuration of a system using the 2P-SRAM 101 illustrated in FIG. 1. Two CPUs 130A and 130B are coupled to the 2P-SRAM 101. The two CPUs 130A and 130B are supplied with different clock signals to operate. Specifically, the CPU 130A operates in synchronization with clock signal CL_A (supplied to port A for the 2P-SRAM 101). The CPU 130B operates in synchronization with clock signal CL_B (supplied to port B for the 2P-SRAM 101). The CPU 130A supplies port A for the 2P-SRAM 101 with address ADD_A and chip selection signal CE_A. The CPU 130B supplies port B for the 2P-SRAM 101 with address ADD_B and chip selection signal CE_B.

An application may supply a common clock signal to ports A and B. FIG. 2B illustrates a configuration of a system used for such a case. The system illustrated in FIG. 2B supplies common clock signal CL to the CPUs 130A and 130B, and ports A and B of the 2P-SRAM 101 in common. The entire system operates in synchronization with common clock signal CL.

Japanese Unexamined Patent Publication No. 2010-135025 discloses the technology that allows one-port SRAM to operate as multi-port SRAM based on an STS (super time sharing) system. The multi-port SRAM disclosed in this publication allows a read port and a write port to operate in synchronization with one clock signal.

Patent Document 1: Japanese Unexamined Patent Publication No. 2010-135025

Non-Patent Document 1: Y. Ishii, et al., "A 28 nm dual-port SRAM macro with screening circuitry against write-read disturb failure issues", A-SSCC 2010 literature number Industry1-2.

SUMMARY

One problem about the DP-SRAM cell or the 2P-SRAM cell is occurrence of "disturb." A disturb error degrades data read or write characteristics if more than one port accesses two memory cells on the same row, namely, two memory cells coupled to the same port-A word line WLA and port-B word line WLB. Accessing two memory cells on the same row degrades lower bound operating voltage.

Data write and read operations collide with each other if more than one port accesses the same memory cell. Accuracy of read data is not ensured.

The disturb problem or the collision between write and read operations becomes more remarkable in the system having the configuration as illustrated in FIG. 2B where the ports operate synchronously. Such a problem needs to be solved.

A semiconductor device according to an embodiment of the present invention includes a first word line and a second word line that are coupled to each memory cell. A read operation activates the first word line corresponding to a selected memory cell. A write operation activates the second word line corresponding to a selected memory cell. The selected second word line is activated after activation of the selected first word line in an operation cycle that performs both read and write operations.

The embodiment can avoid the disturb problem and the collision between write and read operations in a semiconductor device having the DP-SRAM cell or the 2P-SRAM cell.

BRIEF DESCRIPTION OF THE DRAWINGS

FIG. 2A is a block diagram illustrating a system using the 2P-SRAM in FIG. 1;

FIG. 2B is a block diagram illustrating another system using the 2P-SRAM in FIG. 1;

FIG. 5 is a timing chart illustrating write and read operation on the same memory cell in the 2P-SRAM;

DETAILED DESCRIPTION

The following describes the disturb problem and the collision between write and read operations occurring on a DP-SRAM cell and a 2P-SRAM cell according to the related art for ease of understanding the technical concept of the embodiment described below.

Figure 3A:
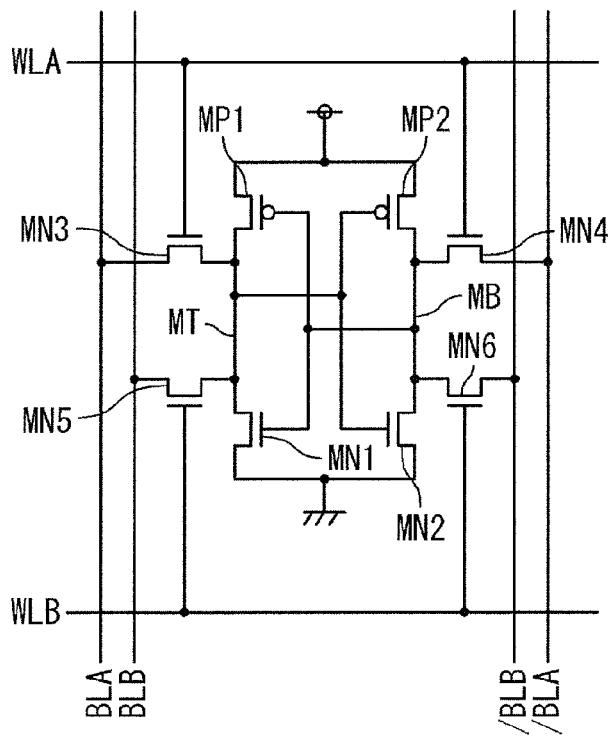
FIG. 3A is a circuit diagram illustrating a configuration of a DP-SRAM cell.
Figure 3B:
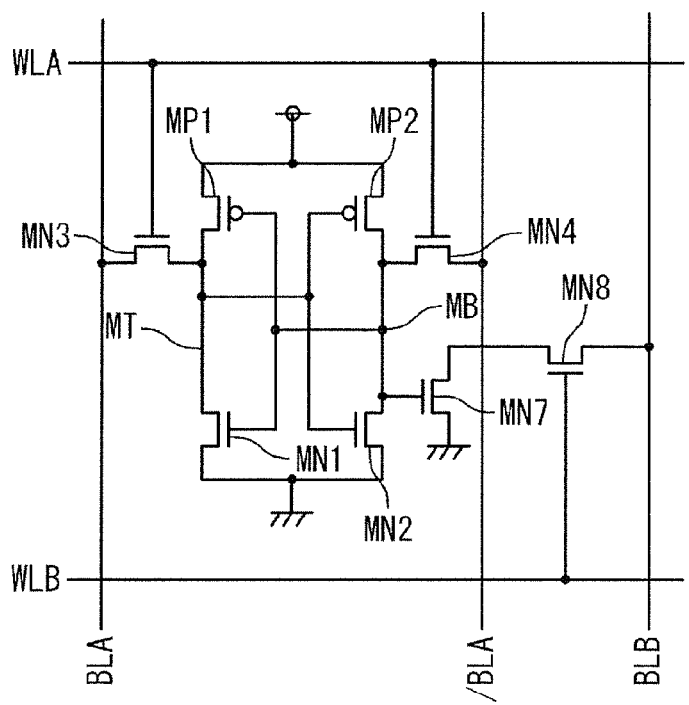
FIG. 3B is a circuit diagram illustrating a configuration of a 2P-SRAM cell.

FIG. 3A illustrates a typical configuration of an 8T DP-SRAM cell using eight transistors. FIG. 3B illustrates a typical configuration of an 8T 2P-SRAM cell.

As illustrated in FIG. 3A, the 8T DP-SRAM cell includes NMOS transistors MN1 through MN6 and PMOS transistors MP1 and MP2. The NMOS transistors MN1 and MN2 and the PMOS transistors MP1 and MP2 configure two cross-coupled inverters. In more detail, the drains of the NMOS transistors MN1 and MN2 are coupled to internal nodes MT and MB, respectively. The sources thereof are grounded in common. The drains of the PMOS transistors MP1 and MP2 are coupled to the internal nodes MT and MB, respectively. The sources thereof are coupled to power supply VDD in common. The gates of the NMOS transistor MN1 and the PMOS transistor MP1 are coupled to the internal node MB in common. The gates of the NMOS transistor MN2 and the PMOS transistor MP2 are coupled to the internal node MT in common.

The NMOS transistors MN3 and MN4 are provided as access transistors between each of the internal nodes MT and MB and each of the pair of port-A bit lines BLA and /BLA. The NMOS transistor MN3 is coupled between the internal node MT and the port-A bit line BLA. The NMOS transistor MN4 is coupled between the internal node MB and the port-A bit line /BLA. The gates of the NMOS transistors MN3 and MN4 are coupled to the port-A word line WLA in common.

The NMOS transistors MN5 and MN6 are provided as access transistors between each of the internal nodes MT and MB and each of the pair of port-B bit lines BLB and /BLB. The NMOS transistor MN5 is coupled between the internal node MT and the port-B bit line BLB. The NMOS transistor MN6 is coupled between the internal node MB and the port-B bit line /BLB. The gates of the NMOS transistors MN5 and MN6 are coupled to the port-B word line WLB in common.

As illustrated in FIG. 3B, the 8T 2P-SRAM cell is configured similarly to the 8T DP-SRAM cell illustrated in FIG. 3A but differs from the latter in coupling relationship between the access transistor and the bit line. The NMOS transistor MN3 is coupled between the internal node MT and the port-A bit line BLA. The NMOS transistor MN4 is coupled between the internal node MB and the port-A bit line /BLA. The source of the NMOS transistor MN7 is grounded. The gate thereof is coupled to the internal node MB. The NMOS transistor MN8 is coupled between the drain of the NMOS transistor MN7 and the port-B bit line BLB. The gate of the NMOS transistor MN8 is coupled to the port-B word line WLB.

Figure 4A:
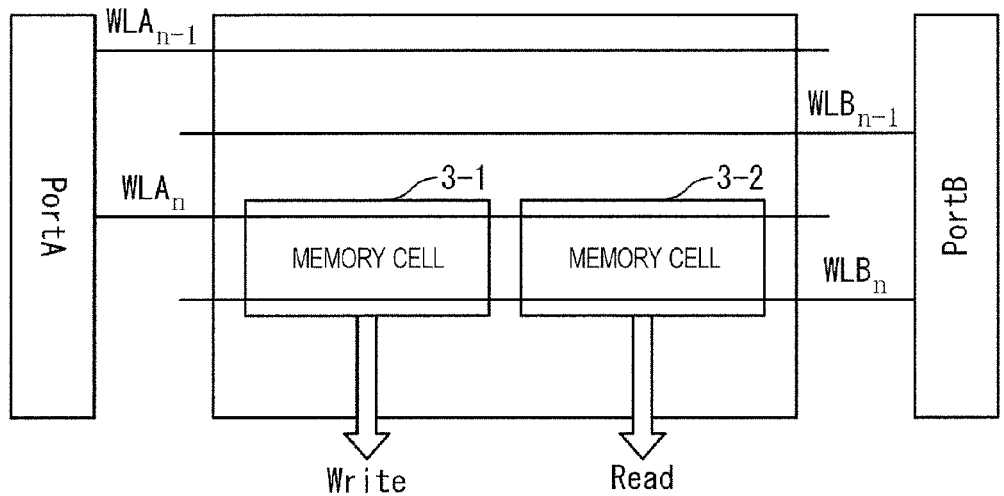
FIG. 4A is a conceptual diagram illustrating operation of the 2P-SRAM when the same row contains a memory cell as a write destination and a memory cell as a read source.

The following describes the disturb problem on the DP-SRAM cell illustrated in FIG. 3A. As illustrated in FIG. 4A, the same row contains two memory cells 3-1 and 3-2 having the configuration as illustrated in FIG. 3A. Port A writes data to the memory cell 3-1. Port B reads data from the memory cell 3-2. The memory cell 3-2 to read data stores data "0." Namely, the internal node MT is set to the L level (ground potential GND) and the internal node MB is set to the H level (power supply potential VDD).

Figure 4B:
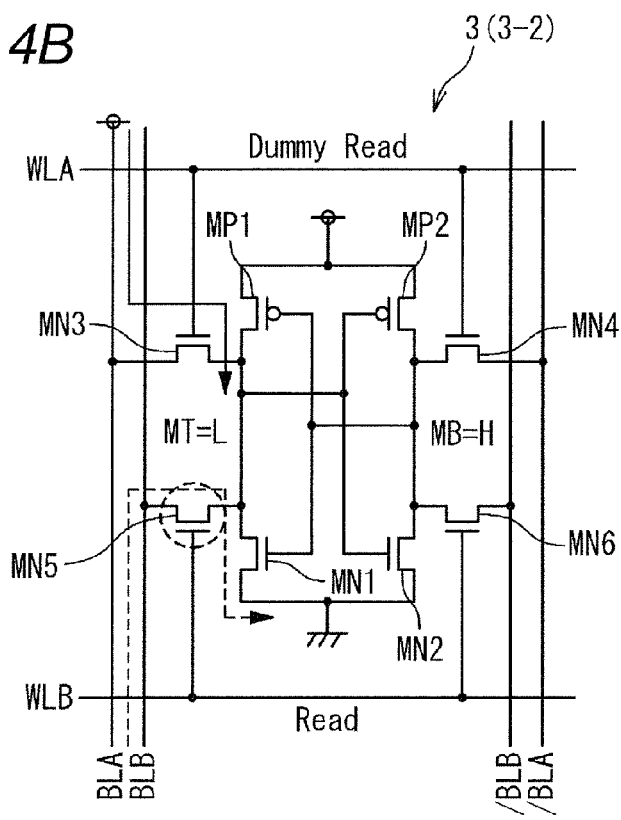
FIG. 4B is a circuit diagram illustrating disturb on the DP-SRAM cell.

FIG. 4B illustrates a state of the memory cell 3-2 (DP-SRAM cell) corresponding to the above-mentioned operation. Reading the memory cell 3-2 activates the port-B word line WLB (set to the H level). Since the internal node MT is set to the L level, the port-B bit line BLB is discharged to read data "0." Port A writes data to the memory cell 3-1 to activate the port-A word line WLA. Port A writes data to the memory cell 3-1, not to the memory cell 3-2. This signifies that a dummy read operation is performed on the memory cell 3-2. In this case, the port-A word line WLA is activated to supply the internal node MT with the potential from the pre-charged port-A bit line BLA and raise the potential for the internal node MT. A voltage between the source and the drain of the NMOS transistor MN5 drops and decreases a current that discharges the port-B bit line BLB to the internal node MT. This causes the sense amplifier to decrease a potential difference in the bit line pair and increases the lower bound operating voltage. This phenomenon is referred to as "read disturb" in the DP-SRAM cell.

A different mechanism causes the disturb problem on the 2P-SRAM cell illustrated in FIG. 3B. Similarly to the discussion about the DP-SRAM cell, the following description supposes that port A writes data to the memory cell 3-1 and port B reads data from the memory cell 3-2. The memory cells 3-1 and 3-2 are each equivalent to the 2P-SRAM cell having the configuration as illustrated in FIG. 3B. The memory cell 3-2 to read data stores data "1." Namely, the internal node MT is set to the H level and the internal node MB is set to the L level.

Figure 4C:
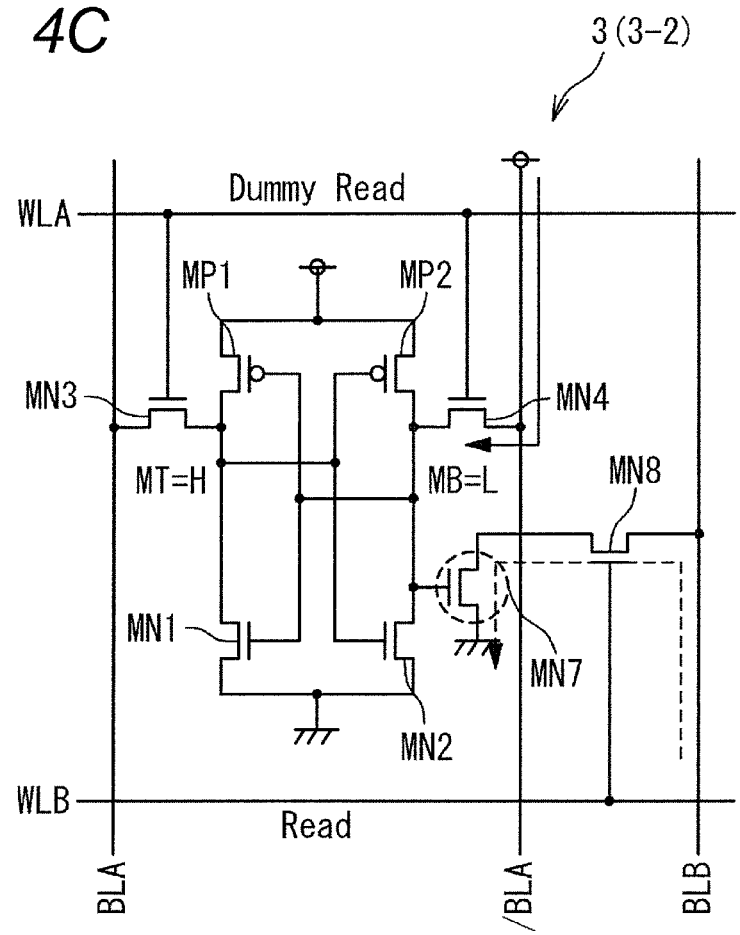
FIG. 4C is a circuit diagram illustrating disturb on the 2P-SRAM cell.

FIG. 4C illustrates a state of the memory cell 3-2 (2P-SRAM cell) corresponding to the above-mentioned operation. Activating the port-B word line WLB (set to the H level) turns on the NMOS transistor MN8 while port B reads data from the memory cell 3-2. Normally, however, the NMOS transistor MN7 should not turn on or apply a cell current because the internal node MB is set to the L level. However, port A writes data to the memory cell 3-1 and activates the port-A word line WLA. The potential then flows to the internal node MB from the pre-charged port-A bit line /BLA and raises the potential of the internal node MB. The NMOS transistor MN7 thereby turns on to apply a cell current that should not be applied in a normal state. Normally, the read bit line for the 2P-SRAM cell is not complementary. The sense amplifier reads a potential difference between the bit line and a reference bit line that is driven at an intermediate discharge rate between reading "1" and reading "0." Applying the cell current incorrectly discharges the port-B bit line BLB, allows the sense amplifier to decrease a potential difference from the reference bit line, and increases the lower bound operating voltage. This phenomenon is referred to as "read disturb" in the 2P-SRAM cell.

One of ports A and B may read data from the memory cell and the other may write data to the same memory cell. In such a case, read and write operations collide with each other and read data is unpredictable. FIG. 5 is a timing chart illustrating operation of the 2P-SRAM in this case. The example in FIG. 5 assumes that port A writes data and port B reads data. Rewriting data activates the port-A word line WLA. Depending on the write data, one of the port-A bit lines BLA and /BLA is set to the ground potential and the other is set to the power supply potential. Then, potentials of the internal nodes MT and MB reverse after a given delay.

During the read operation on port B, the read data depends on before and after the timing to activate the sense amplifier and the timing to reverse potentials of the internal nodes MT and MB. The read data matches write data if the potentials of the internal nodes MT and MB reverse before the sense amplifier is activated to read data. The read data matches data stored in the memory cell 3-2 before writing if the potentials of the internal nodes MT and MB reverse after the data is read. The timing to reverse the potentials of the internal nodes MT and MB depends on variations in a threshold voltage for an MOS transistor included in the memory cell 3-2. Variations in the threshold voltage for the MOS transistor depend on memory cells. The memory cells determine whether the read data matches write data or data stored in the memory cell before writing. Basically, read data cannot be ensured if a write operation and a read operation are simultaneously performed on the same cell.

The above-mentioned problem is characteristic of the DP-SRAM cell and the 2P-SRAM cell. The problem is inapplicable to the one-port SRAM operating as a multi-port SRAM according to the STS (super time sharing) system disclosed in Japanese Unexamined Patent Publication No. 2010-135025. Only one word line is coupled to the memory cells for the SRAM described in Japanese Unexamined Patent Publication No. 2010-135025. The SRAM is free from the disturb problem and the collision between write and read operations described above.

To solve the disturb problem, the semiconductor device according to the embodiment allows the read timing to differ from the write timing in the corresponding operation cycle. In addition, the semiconductor device according to the embodiment reads data before writing data. The semiconductor device thereby ensures the read data in the event of a request to simultaneously perform write operation and read operation on the same memory cell at a specific operation cycle. The semiconductor device alleviates the address limitation on simultaneous access. The semiconductor device according to the embodiment will be described in detail below.

Figure 6:
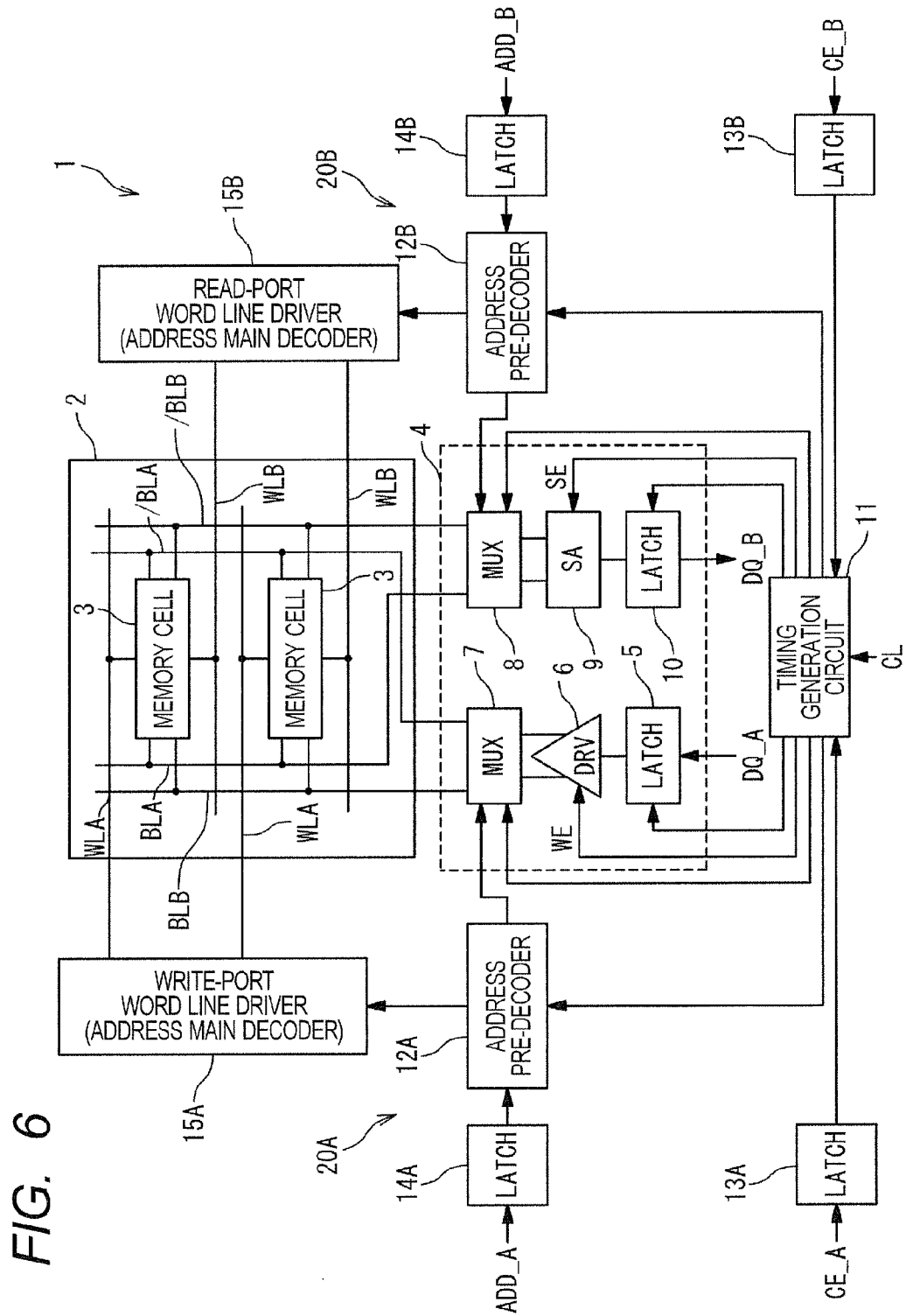
FIG. 6 is a block diagram illustrating a configuration of a semiconductor device according to an embodiment.

FIG. 6 is a block diagram illustrating a configuration of a semiconductor device 1 according to the embodiment. The semiconductor device 1 according to the embodiment is configured as a 2P-SRAM having two ports, namely, a write port and a read port. In detail, the semiconductor device 1 includes a memory cell array 2, an I/O circuit 4, a timing generation circuit 11, a write-port peripheral circuit 20A, and a read-port peripheral circuit 20B.

The memory cell array 2 includes memory cells 3 arranged in columns and rows. The memory cell array 2 is provided with a write word line WLA, a read word line WLB, a pair of write bit lines BLA and /BLA, a pair of read bit lines BLB and /BLB. FIG. 6 illustrates the configuration of the memory cell array 2 of the memory cells 3 each having the configuration illustrated in FIG. 3A. The memory cell 3 may have the configuration illustrated in FIG. 3B. In this case, the memory cell array 2 is not provided with the read bit line /BLB.

The I/O circuit 4 includes an input latch 5, a write driver 6, multiplexers 7 and 8, a sense amplifier 9, and an output latch 10. The input latch 5, the write driver 6, and the multiplexer 7 provide circuits related to write operation. The input latch 5 receives input data DQ_A and supplies it to the write driver 6. In response to input data DQ_A, the write driver 6 outputs a voltage that drives the pair of write bit lines BLA and /BLA coupled to the memory cell 3 as a data write destination. The multiplexer 7 selects the pair of write bit lines BLA and /BLA corresponding to the memory cell 3 as a data write destination. The multiplexer 7 also pre-charges the pair of write bit lines BLA and /BLA.

The multiplexer 8, the sense amplifier 9, and the output latch 10 provide circuits related to read operation. The multiplexer 8 selects the pair of read bit lines BLB and /BLB corresponding to the memory cell 3 as a data read source. The multiplexer 8 also pre-charges the pair of read bit lines BLB and /BLB. The sense amplifier 9 compares the selected pair of read bit lines BLB and /BLB and determines data written to the memory cell 3 as a data read source. The output latch 10 outputs the data determined by the sense amplifier 9 as output data DQ_B.

The write-port peripheral circuit 20A includes an address pre-decoder 12A, latch circuits 13A and 14A, and a write-port word line driver 15A. The address pre-decoder 12A decodes address ADD_A for the write port to generate a pre-decoded signal and supplies the pre-decoded signal to the write-port word line driver 15A and the multiplexer 7. The first latch circuit 13A latches chip selection signal CE_A for the write port and supplies it to the timing generation circuit 11. The second latch circuit 14A latches address ADD_A for the write port and supplies it to the address pre-decoder 12A. The write-port word line driver 15A functions as an address main decoder that operates in response to the pre-decoded signal received from the address pre-decoder 12A. The write-port word line driver 15A decodes the received pre-decoded signal and selects the write word line WLA coupled to the memory cell 3 as a data write destination.

The read-port peripheral circuit 20B includes an address pre-decoder 12B, latch circuits 13B and 14B, and a read-port word line driver 15B. The address pre-decoder 12B supplies the read-port word line driver 15B and the multiplexer 8 with a pre-decoded signal corresponding to address ADD_B for the read port. The first latch circuit 13B latches the chip selection signal CE_B for the read port and supplies it to the timing generation circuit 11. The second latch circuit 14B latches address ADD_B for the read port and supplies it to the address pre-decoder 12B. The read-port word line driver 15B functions as an address main decoder that operates in response to the pre-decoded signal received from the address pre-decoder 12B. The read-port word line driver 15B decodes the received pre-decoded signal and selects the read word line WLB coupled to the memory cell 3 as a data read source.

The timing generation circuit 11 controls timings of the circuits in the semiconductor device 1. The timing generation circuit 11 generates various control signals such as sense enable signal SE and write enable signal WE in synchronization with common clock signal CL. The semiconductor device 1 according to the embodiment allows both the write port and the read port to operate in synchronization with common clock signal CL. This configuration is useful for the system having the configuration as illustrated in FIG. 2B, for example. According to this configuration, the common clock signal CL is supplied to two CPUs. The two CPUs access the semiconductor device 1 according to the embodiment.

Figure 1:
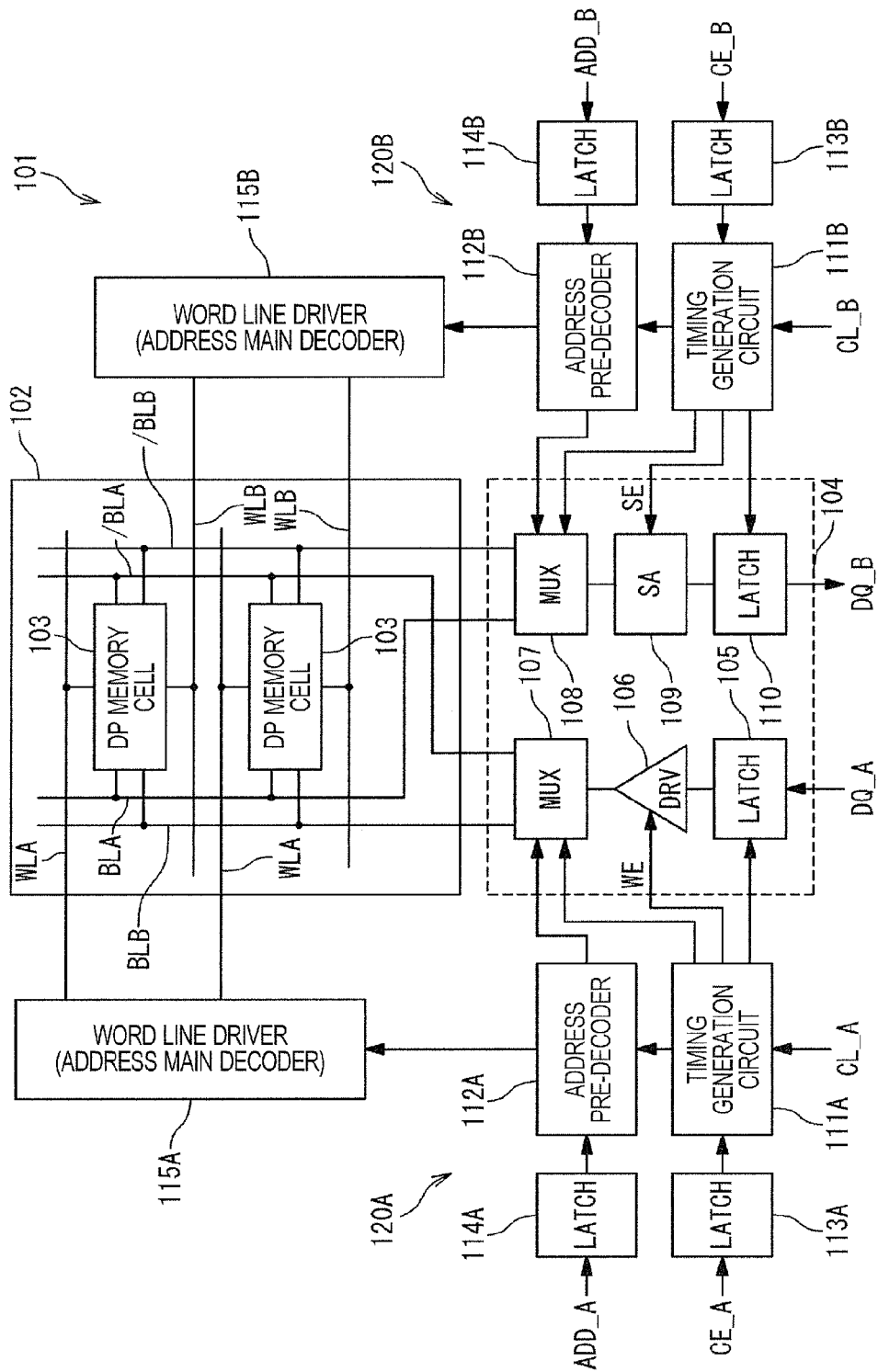
FIG. 1 is a block diagram illustrating a configuration of a 2P-SRAM.

The semiconductor device 1 according to the embodiment allows the input latch 5, the write driver 6, and the multiplexer 7 of the I/O circuit 4 and the write-port peripheral circuit 20A to function as the write port. The semiconductor device 1 allows the multiplexer 8, the sense amplifier 9, and the output latch 10 thereof and the read-port peripheral circuit 20B to function as the read port. The write port and the read port share the timing generation circuit 11. The timing generation circuit 11 controls timings by supplying a control signal to both the circuits belonging to the write port and the circuits belonging to the read port. In other words, read and write operations are performed via the two ports in synchronization with the common clock. This configuration has the advantage of decreasing the area and reducing the power consumption over the configuration as illustrated in FIG. 1 that provides each port with the timing generation circuit.

Figure 7A:
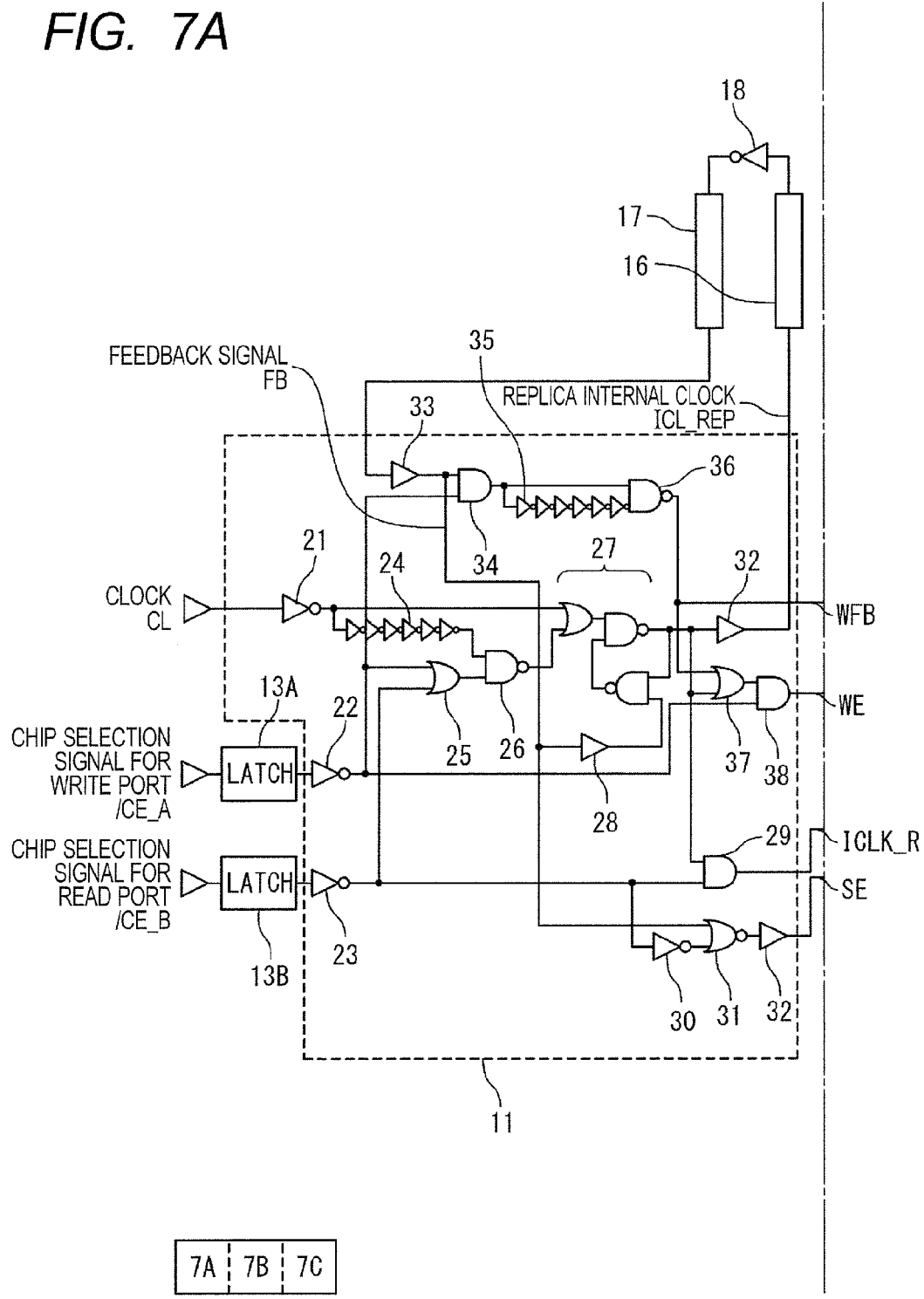
FIG. 7A is a circuit diagram illustrating in detail the configuration of the semiconductor device according to the embodiment.
Figure 7B:
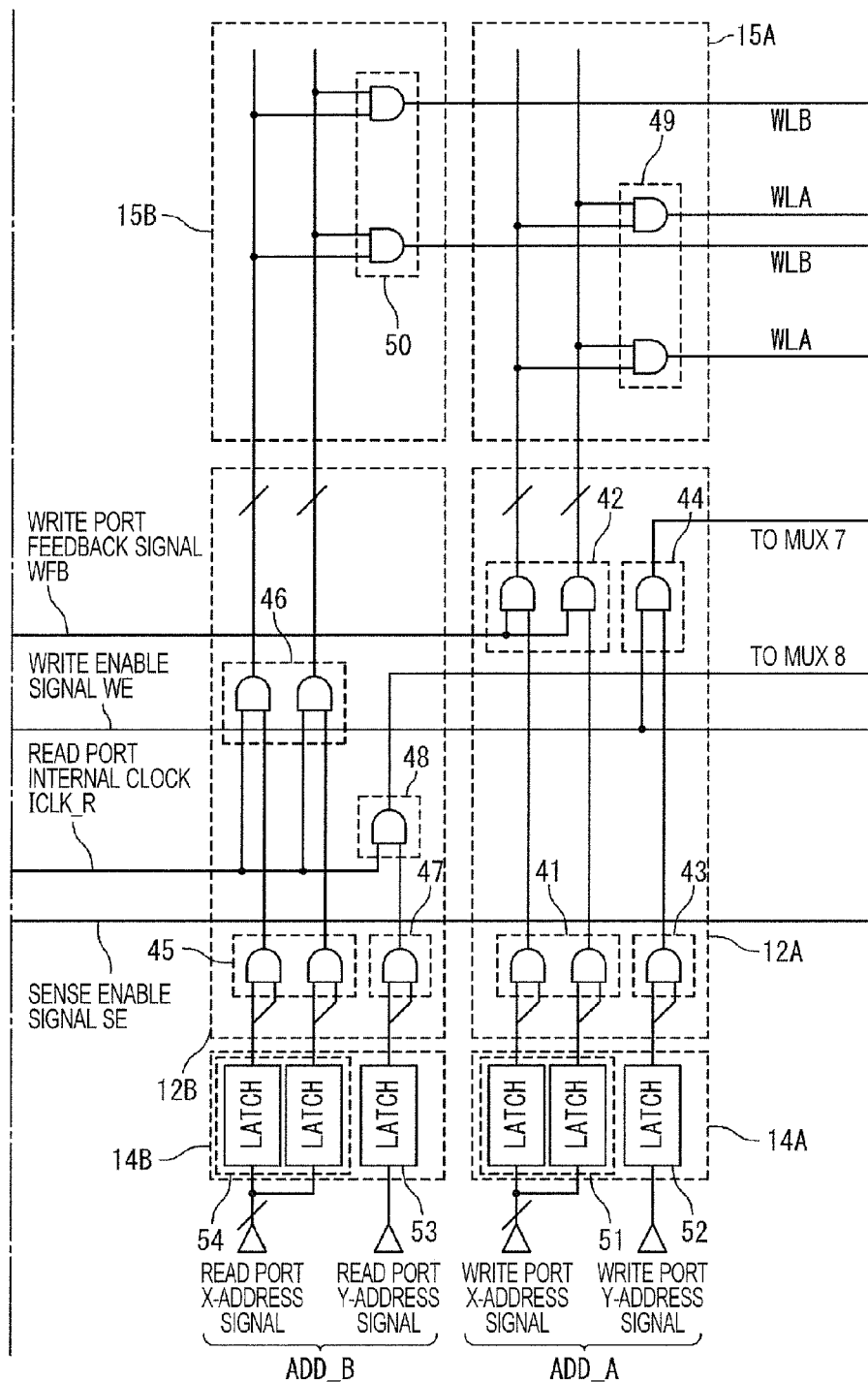
FIG. 7B is a circuit diagram illustrating in detail the configuration of the semiconductor device according to the embodiment.
Figure 7C:
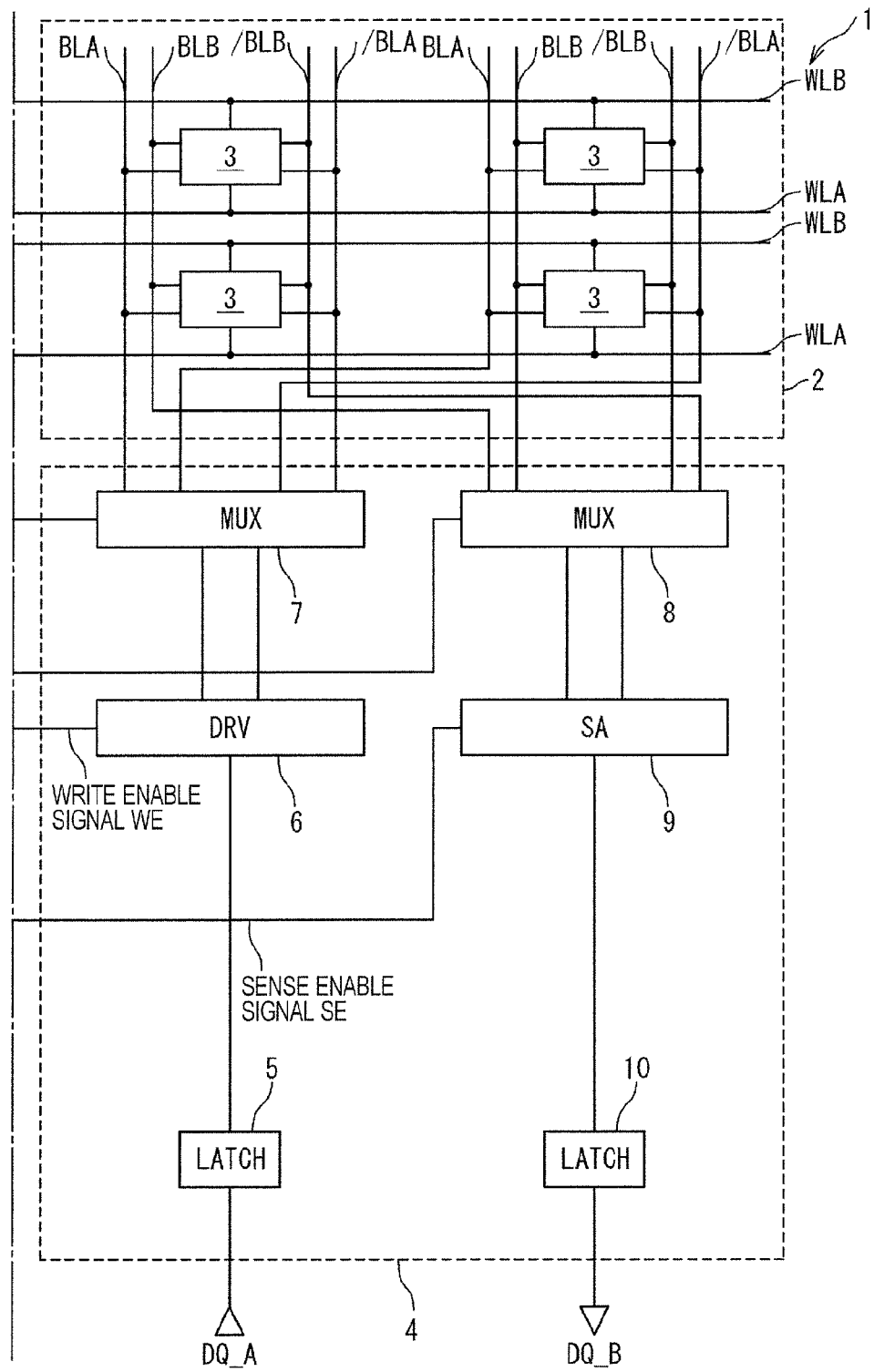
FIG. 7C is a circuit diagram illustrating in detail the configuration of the semiconductor device according to the embodiment.

FIGS. 7A through 7C are circuit diagrams schematically illustrating in detail the configuration of the semiconductor device 1 according to the embodiment. As illustrated in FIG. 7a, the timing generation circuit 11 includes inverter 21, inverters 22, 23, a delay circuit 24, an OR gate 25, a NAND gate 26, an RS latch 27, a buffer 28, an AND gate 29, an inverter 30, a NOR gate 31, buffers 32 and 33, an AND gate 34, a write period ensuring delay circuit 35, a NAND gate 36, an OR gate 37, and an AND gate 38.

The timing generation circuit 11 according to this configuration generates write port feedback signal WFB, write enable signal WE, read port internal clock ICLK_R, and sense enable signal SE in response to common clock signal CL, chip selection signal /CE_A for the write port, and chip selection signal /CE_B for the read port. The configurations in FIGS. 7A through 7C assume chip selection signals /CE_A and /CE_B to be low active. Write port feedback signal WFB is equivalent to a timing control signal that controls timing to activate write word line WLA. Write enable signal WE is equivalent to a timing control signal that controls timing to activate the write driver 6. Read port internal clock ICLK_R is equivalent to a timing control signal that controls timing to activate read word line WLB. Sense enable signal SE is equivalent to a timing control signal that controls timing to activate the sense amplifier 9.

The timing generation circuit 11 is coupled to a replica word line load 16, a replica bit line load 17, and an inverter 18. The replica word line load 16 simulates read word line WLB for the memory cell array 2 and provides the delay time corresponding to each read word line WLB. The replica bit line load 17 simulates a pair of read bit lines BLB and /BLB and provides the delay time corresponding to each pair of read bit lines BLB and /BLB. To be described later, the replica word line load 16, the replica bit line load 17, and the inverter 18 function as a delay circuit and are used to generate write word line WLA and sense enable signal SE. The replica word line load 16, the replica bit line load 17, and the inverter 18 may be replaced by a delay circuit that provides the delay time equivalent to the sum of the delay time corresponding to each read word line WLB and the delay time corresponding to each pair of read bit lines BLB and /BLB.

The function of the timing generation circuit 11 is outlined below. Suppose at least one of chip selection signals /CE_A and /CE_B is activated. In this state, raising common clock signal CL sets the RS latch 27. An output signal from the RS latch 27 is used to generate write enable signal WE, read port internal clock ICLK_R, and replica internal clock ICL_REP.

That is, the output signal from the RS latch 27 is used as a timing control signal that controls timings of write enable signal WE, read port internal clock ICLK_R, and replica internal clock ICL_REP.

The replica word line load 16, the replica bit line load 17, and the inverter 18 delay replica internal clock ICL_REP to generate feedback signal FB. Sense enable signal SE and write port feedback signal WFB are generated from feedback signal FB. Read port internal clock ICLK_R is generated from the output from the RS latch 27. Write port feedback signal WFB is generated from feedback signal FB. As a result, write word line WLA is activated later than read word line WLB.

As illustrated in FIG. 7B, the latch circuit 14A includes latches 51 and 52. The latch circuit 14B includes latches 53 and 54. Address ADD_A for the write port is input to the latch circuit 14A and contains a write port X-address signal and a write port Y-address signal. Similarly, address ADD_B for the read port is input to the latch circuit 14B and contains a read port X-address signal and a read port Y-address signal. The latches 51 and 52 of the latch circuit 14A latch the write port X-address signal and the write port Y-address signal, respectively, and transmit the signals to the address pre-decoder 12A for the write port. Similarly, the latches 53 and 54 of the latch circuit 14B latch the read port X-address signal and the read port Y-address signal, respectively, and transmit the signals to the address pre-decoder 12B for the read port.

The address pre-decoder 12A for the write port is provided with AND gate groups 41 through 44. The AND gate groups 41 and 42 decode the write port X-address signal to generate a write port pre-decoded signal and transmit it to the write-port word line driver 15A. The AND gate group 42 operates in synchronization with the write port feedback signal WFB. Therefore, the write port pre-decoded signal is also generated in synchronization with the write port feedback signal WFB. The AND gate groups 43 and 44 decode the write port Y-address signal and supply it to the multiplexer 7. The multiplexer 7 selects the pair of write bit lines BLA and /BLA in response to the output signal from the AND gate group 44. The AND gate group 44 operates in response to the write enable signal WE. Therefore, the pair of write bit lines BLA and /BLA is also selected in response to the write enable signal WE.

Similarly, the address pre-decoder 12B for the read port is provided with AND gate groups 45 through 48. The AND gate groups 45 and 46 decode the read port X-address signal to generate a read port pre-decoded signal and transmit it to the read-port word line driver 15B. The AND gate group 46 operates in synchronization with the read port internal clock ICLK_R. Therefore, the read port pre-decoded signal is also generated in synchronization with the read port internal clock ICLK_R. The AND gate groups 47 and 48 decode the read port Y-address signal and supply it to the multiplexer 8. The multiplexer 8 selects the pair of read bit lines BLB and /BLB in response to the output signal from the AND gate group 48. The AND gate group 48 operates in response to the read port internal clock ICLK_R. Therefore, the pair of read bit lines BLB and /BLB is also selected in response to the read port internal clock ICLK_R.

The write-port word line driver 15A is provided with an AND gate group 49. The AND gate group 49 further decodes the write port pre-decoded signal received from the address pre-decoder 12A and selects the write word line WLA corresponding to the memory cell 3 as a write destination.

Similarly, the read-port word line driver 15B is provided with an AND gate group 50. The AND gate group 50 further decodes the read port pre-decoded signal received from the address pre-decoder 12B and selects the read word line WLB corresponding to the memory cell 3 as a read source.

FIG. 7C illustrates configurations of the memory cell array 2 and the I/O circuit 4. As described above, the memory cell array 2 includes more than one memory cell 3 arranged in rows and columns, the write word line WLA provided for each row of the memory cell array 2, the read word line WLB provided for each row of the memory cell array 2, the pair of write bit lines BLA and /BLA provided for each column of the memory cell array 2, and the pair of read bit lines BLB and /BLB provided for each column of the memory cell array 2. Each write word line WLA is activated when the corresponding row is selected during write operation. The I/O circuit 4 includes the input latch 5, the write driver 6, the multiplexers 7 and 8, the sense amplifier 9, and the output latch 10. The multiplexer 7 couples the pair of write bit lines BLA and /BLA to the write driver 6 if the pair corresponds to the column selected during the write operation. The multiplexer 7 allows the write driver 6 to transfer write data to the selected pair of write bit lines BLA and /BLA. The multiplexer 8 couples the pair of read bit lines BLB and /BLB to the sense amplifier 9 if the pair corresponds to the column selected during the read operation. The multiplexer 8 transfers read data to the sense amplifier 9 from the selected pair of read bit lines BLB and /BLB.

Figure 8:
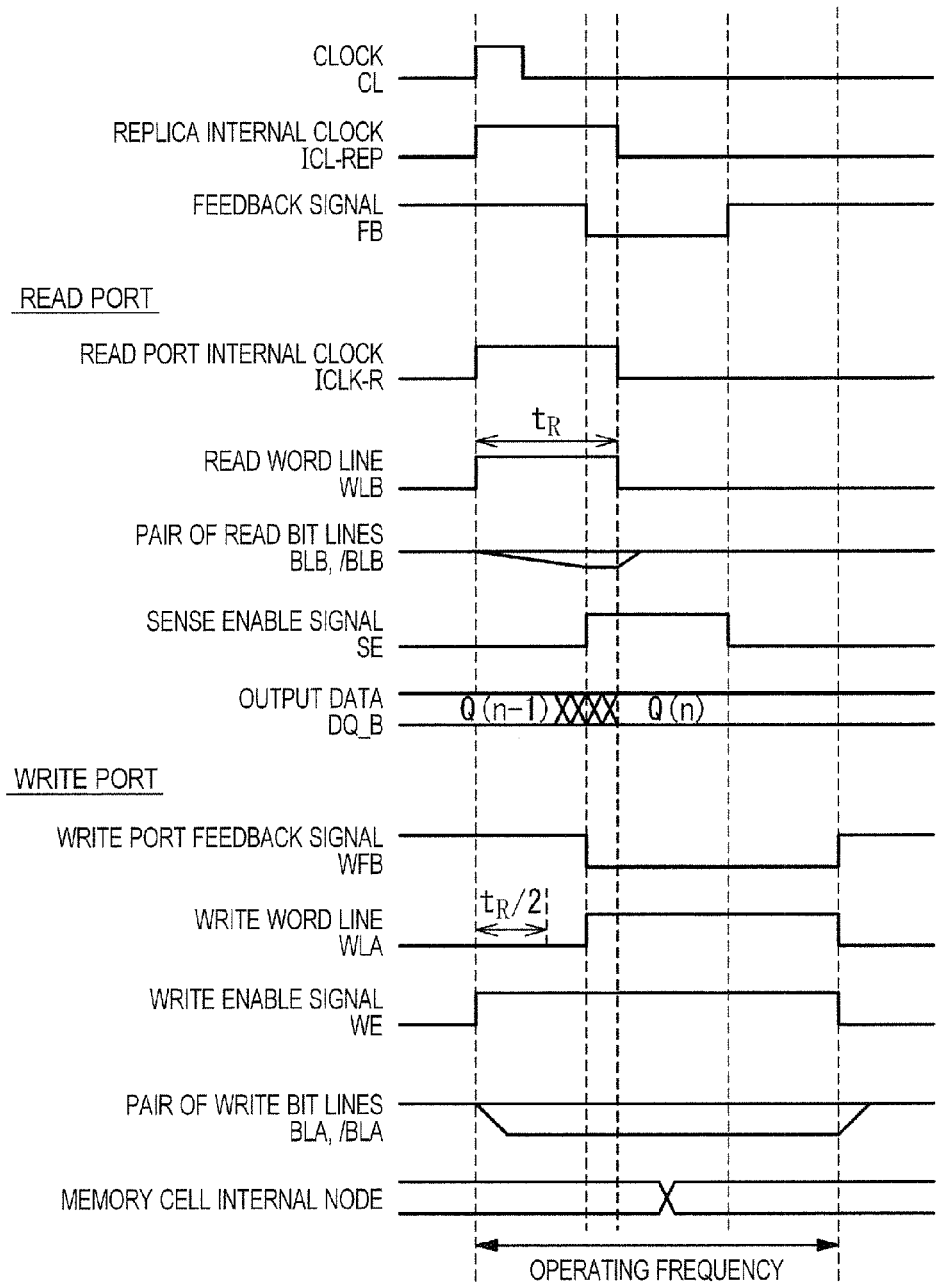
FIG. 8 is a timing chart illustrating operation of the semiconductor device according to the embodiment.

FIG. 8 is a timing chart illustrating operation of the semiconductor device 1 according to the embodiment when both a write operation and a read operation are performed at a specific operation cycle defined as a time interval between rising edges of common clock signal CL.

Chip selection signal /CE_A for the write port and chip selection signal /CE_B for the read port are activated if both a write operation and a read operation are performed at a specific operation cycle. If common clock signal CL is pulled up to H in this state, the timing generation circuit 11 detects a rising edge of common clock signal CL to set the RS latch 27.

Setting the RS latch 27 raises replica internal clock ICL_REP generated from an output signal from the RS latch 27. The replica word line load 16 is thereby charged. The replica bit line load 17 is discharged. Read port internal clock ICLK_R rises almost at the same time as replica internal clock ICL_REP rises to activate read word line WLB selected by the address pre-decoder 12B for the read port and the read-port word line driver 15B. As a result, the pair of read bit lines BLB and /BLB specified by the address pre-decoder 12B reads data from the memory cell 3 as a read source.

On the other hand, the write port raises write enable signal WE to activate the write driver 6. In addition, the pair of write bit lines BLA and /BLA specified by the address pre-decoder 12A is driven.

The important point is that write word line WLA is not activated yet. Therefore, the memory cell 3 as a read source is free from the disturb due to a write operation and the lower bound operating voltage does not degrade even if the same row contains the memory cell 3 as a write destination and the memory cell 3 as a read source.

The discharge from the replica bit line load 17 is complete after a given time. The replica bit line load 17 and the inverter 18 are designed in advance so that the discharge operation takes approximately the same time as needed for the data read. Feedback signal FB is activated when the discharge from the replica bit line load 17 is complete. It should be noted that feedback signal FB according to the embodiment is low active. In response to activation of feedback signal FB, the read port raises sense enable signal SE to activate sense amplifier 9 and read data.

At this time, data is not yet written to the memory cell 3. Data stored in the memory cell 3 as a read source is sure to be read. That is, read data can be ensured even if the memory cell 3 is selected as a write destination in addition to being selected as a read source.

Activating feedback signal FB activates write port feedback signal WFB. This activates write word line WLA selected by the address pre-decoder 12A for the write port and the write-port word line driver 15A. It should be noted that write port feedback signal WFB according to the embodiment is low active.

At this time, the pair of write bit lines BLA and /BLA is already driven. Therefore, data is written to the memory cell 3 simultaneously with activation of the selected write word line WLA. The pair of write bit lines BLA and /BLA is driven before activation of the selected write word line WLA. This is effective for shortening the time required for the write operation and increasing the operating frequency.

It should be noted that write word line WLA is activated no earlier than (i.e., simultaneously with or later than) the timing to activate sense enable signal SE (i.e., to activate the sense amplifier 9). In other words, the sense amplifier is activated no later than (i.e., simultaneously with or earlier than) when the write word line WLA is activated. This is important from the viewpoint of ensuring read data. Read data is determined at the timing to activate sense enable signal SE. The timing to activate write word line WLA just needs to be subsequent to the timing to activate sense enable signal SE. Under this condition, read data can be ensured even if a write operation and a read operation are performed on the same memory cell.

The timing to activate write word line WLA may precede or follow the timing to inactivate read word line WLB. The timing to activate write word line WLA is favorably later than the middle of a period during which read word line WLB is activated in order to reliably avoid degradation of the lower bound operating voltage due to read operation disturb. Suppose tR denotes the duration to activate read word line WLB. Then, the timing to activate write word line WLA favorably occurs after a lapse of time tR/2 from the timing to activate read word line WLB. According to the timing chart in FIG. 8, the timing to activate write word line WLA precedes the timing to inactivate read word line WLB and occurs after a lapse of time tR/2 from the timing to activate read word line WLB.

The timing to activate write word line WLA may follow the timing to inactivate read word line WLB. In this case, the write operation is free from the disturb due to a read operation and is capable of preventing degradation of the lower bound operating voltage during a write operation.

The RS latch 27 of the timing generation circuit 11 is reset in response to activation of feedback signal FB. Replica internal clock ICL_REP lowers after a lapse of the short delay time from the reset of the RS latch 27. Read port internal clock ICLK_R lowers to inactivate read word line WLB.

After that, replica internal clock ICL_REP lowers to discharge the replica word line load 16 and charge the replica bit line load 17. The feedback signal FB is then inactivated or raised. Write port feedback signal WFB is thereby inactivated. Selected write word line WLA also falls. The write operation thus terminates.

The write period ensuring delay circuit 35 mainly ensures the time needed for writing. The write period ensuring delay circuit 35 ensures the sufficient delay time from inactivation of the feedback signal FB to inactivation (rising) of the write port feedback signal WFB. The design principle is to sufficiently shorten the time needed to discharge the replica word line load 16 and charge the replica bit line load 17 in order to accelerate operation when the write port is not selected (to be described).

The memory cell accessed from the read port and the memory cell accessed from the write port may belong to the same row. The memory cell may or may not be the same. In such a case, the embodiment performs read and write operations on the memory cells in the 2P-SRAM according to the operation timings for the read port and the write port illustrated in FIG. 8. The memory cell accessed from the read port and the memory cell accessed from the write port may belong to different rows. In such a case, the write word line need not be always activated after activation of the read word line. The write word line may be activated simultaneously with activation of the read word line. For the purpose of simplifying the design of the timing generation circuit, however, the embodiment assumes read and write operations to be performed at the timings illustrated in FIG. 8 even if the memory cell accessed from the read port and the memory cell accessed from the write port belong to different rows.

Figure 9:
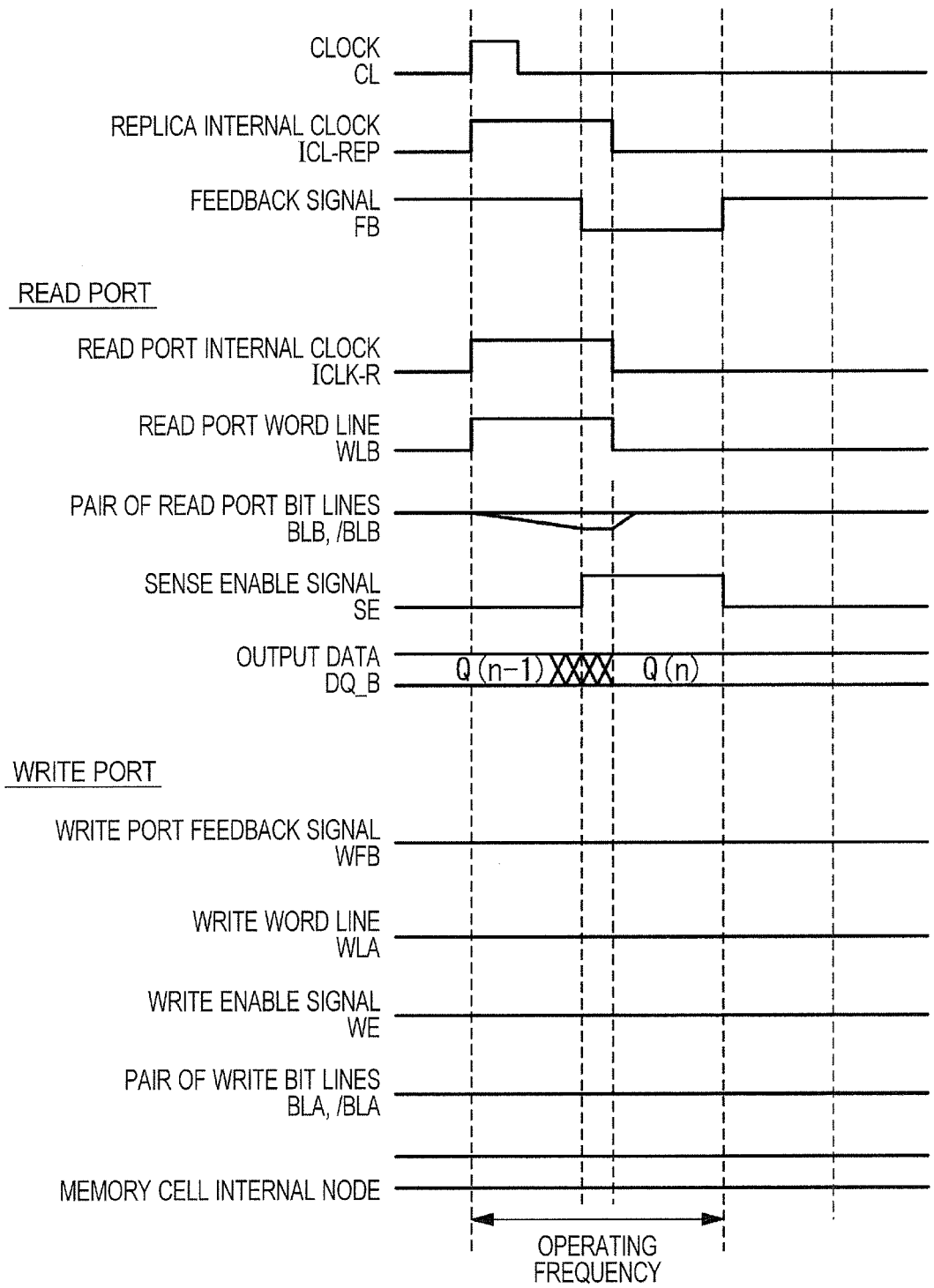
FIG. 9 is a timing chart illustrating operation of the semiconductor device according to the embodiment.

FIG. 9 is a timing chart illustrating operation of the semiconductor device 1 according to the embodiment when only a read operation is performed and no write operation is performed while the write port is not selected, namely, while a specific operation cycle is active. Output from the AND gate 34 always remains at the L level if no write operation is performed, namely, if chip selection signal /CE_A is set to the H level. Accordingly, the write period ensuring delay circuit 35 is inactivated. No operation is performed after activation of write port feedback signal WFB in FIG. 9. In this case, the semiconductor device 1 according to the embodiment can be operated at a frequency higher than that for the case of performing both a read operation and a write operation.

Figure 10:
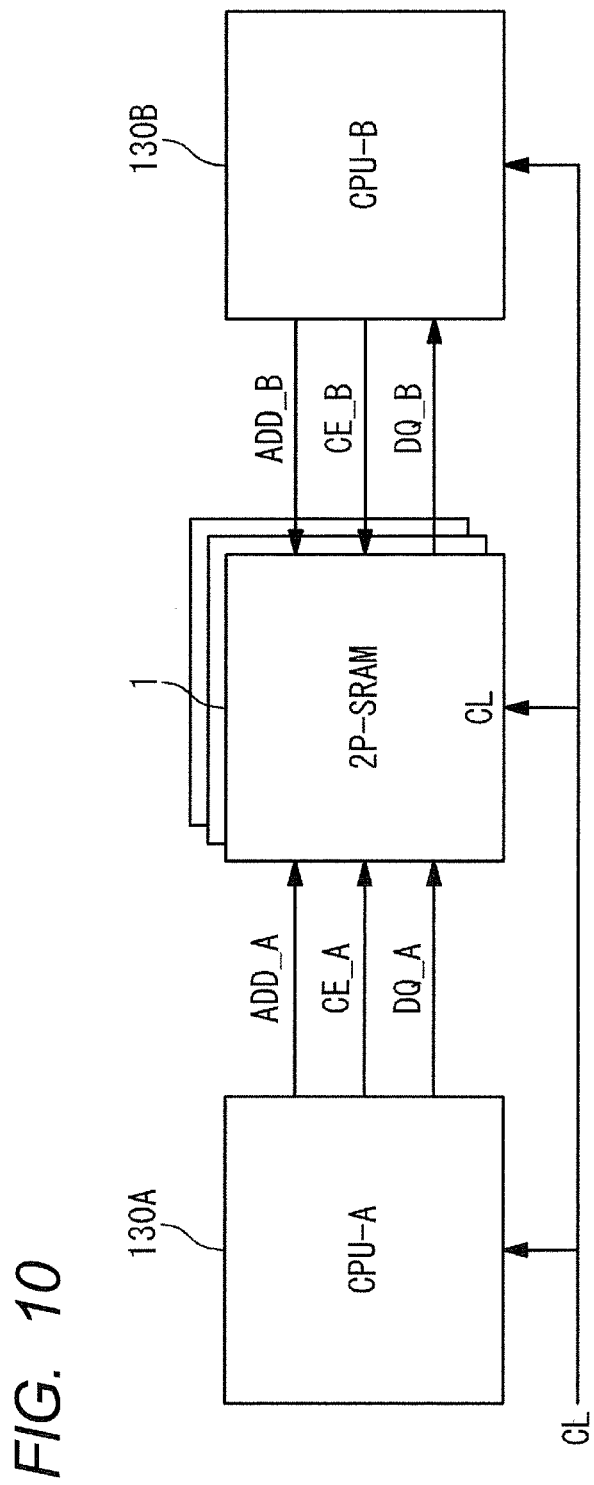
FIG. 10 is a block diagram illustrating a system using the semiconductor device illustrated in FIG. 6.

FIG. 10 is a block diagram illustrating a configuration of a system that uses the semiconductor device 1 according to the embodiment. Two CPUs 130A and 130B are coupled to the semiconductor device 1 configured as 2P-SRAM according to the embodiment. The CPU 130A supplies the semiconductor device 1 with address ADD_A, chip selection signal CE_A, and input data DQ_A. The CPU 130B supplies the semiconductor device 1 with address ADD_B and chip selection signal CE_B and receives output data DQ_B from the semiconductor device 1. The system in FIG. 10 supplies common clock signal CL to the CPUs 130A and 130B, and the semiconductor device 1 in common. The entire system operates in synchronization with common clock signal CL. The operation as illustrated in FIG. 8 or 9 activates write word line WLA after activating read word line WLB. This operation is especially suitable for the system that operates in synchronization with common clock signal CL as illustrated in FIG. 10.

As described above, the semiconductor device 1 according to the embodiment activates the write word line WLA after activating the read word line WLB. The semiconductor device 1 can thereby prevent degradation of the lower bound operating voltage if write and read operations are performed in the same operation cycle on different memory cells at the same row. Data stored in the memory cell can be always read even if write and read operations are performed on the same memory cell in the same operation cycle.

While the 2P-SRAM has been described, the embodiment can provide an effect similar to the above for DP-SRAM that includes the memory cell as illustrated in FIG. 3A and is capable of read and write operations on both ports. For this purpose, the word line for writing is activated after activating the word line for reading if write and read operations are performed in the same operation cycle at the same row.

While there has been described the specific preferred embodiment of the present invention, it is to be distinctly understood that the present invention is not limited thereto but may be otherwise variously embodied within the spirit and scope of the invention. For example, the embodiment describes the semiconductor device that includes the write port and the read port. The invention can be also applicable to a semiconductor device that includes two ports each corresponding to a write operation and a read operation.

What is claimed is:

1. A semiconductor device comprising:
a plurality of first word lines;
a plurality of second word lines;
a plurality of memory cells, each memory cell being coupled to a corresponding one of the first word lines and a corresponding one of the second word lines, said each memory cell becoming accessible when at least one of the corresponding first word line and the corresponding second word line is activated; and
a first word line selection circuit that activates a selected one of the first word lines during a read operation; and
a second word line selection circuit that activates a selected one of the second word lines during a write operation,
wherein the selected second word line is activated after the selected first word line is activated, in a single operation cycle performing both the read operation and the write operation.

2. The semiconductor device according to claim 1, further comprising:
a sense amplifier that receives data stored in a memory cell coupled to the selected first word line,
wherein the selected second word line is activated no earlier than when the sense amplifier is activated.

3. The semiconductor device according to claim 1,
wherein the selected second word line is activated before the selected first word line is deactivated.

4. The semiconductor device according to claim 1, further comprising:
a plurality of bit lines; and
a drive circuit;
wherein each memory cell is coupled to a corresponding one of the bit lines;
wherein the drive circuit drives a selected one of the plurality of bit lines during a write operation, and
wherein the drive circuit is configured to drive the selected bit line before the selected second word line is activated.

5. The semiconductor device according to claim 4, further comprising:
a sense amplifier that receives data stored in a memory cell coupled to the selected first word line,
wherein the drive circuit is configured to drive the selected bit line before the sense amplifier is activated.

6. The semiconductor device according to claim 1, further comprising:
a timing generation circuit configured to generate a first timing control signal to activate the selected first word line and also generate a second timing control signal to activate the selected second word line,
wherein the timing generation circuit includes a delay circuit that delays the first timing control signal to generate a delay signal; and
wherein the second timing control signal is generated from the delay signal.

7. The semiconductor device according to claim 6, further comprising:
a sense amplifier that receives data stored in a memory cell coupled to the selected first word line, wherein the timing generation circuit generates a third timing control signal from the delay signal, the third timing control signal being configured to activate the sense amplifier, and wherein the third timing control signal is configured to activate the sense amplifier no later than when selected second word line is activated by the second timing control signal.

8. The semiconductor device according to claim 6, further comprising:

a plurality of bit lines; and a drive circuit, wherein the memory cells are each coupled to a corresponding one of the bit lines, wherein the drive circuit drives a selected one of the plurality of bit lines during a write operation;

wherein the timing generation circuit generates a fourth timing control signal from the first timing control signal, the fourth timing control signal being configured to activate the drive circuit to drive the selected bit line; and wherein the fourth timing control signal is configured to activate the drive circuit to drive the selected bit line before the selected second word line is activated by the second timing control signal.

9. The semiconductor device according to claim 1, wherein tR denotes a period during which the selected first word line is activated, and the selected second word line is activated after time tR/2 has elapsed from when the selected first word line is activated.

* * * * *